(12) United States Patent
Sogabe

(10) Patent No.: US 12,254,221 B2
(45) Date of Patent: Mar. 18, 2025

(54) MAGNETIC DISK APPARATUS AND METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Keigo Sogabe, Chigasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 49 days.

(21) Appl. No.: 17/903,905

(22) Filed: Sep. 6, 2022

(65) Prior Publication Data

US 2023/0305758 A1 Sep. 28, 2023

(30) Foreign Application Priority Data

Mar. 22, 2022 (JP) .................................. 2022-045009

(51) Int. Cl.
*G06F 3/00* (2006.01)
*G06F 3/06* (2006.01)
(Continued)

(52) U.S. Cl.
CPC ........ *G06F 3/0676* (2013.01); *G06F 12/0246* (2013.01); *G11C 11/401* (2013.01); *G11C 11/5642* (2013.01); *G11C 16/06* (2013.01); *G06F 2212/2022* (2013.01); *G11C 2211/5647* (2013.01)

(58) Field of Classification Search
CPC .............. G06F 3/0676; G06F 12/0246; G06F 2212/2022; G06F 2211/5647; G11C 11/401; G11C 11/5652; G11C 16/06
See application file for complete search history.

(56) References Cited

U.S. PATENT DOCUMENTS 6,295,577 B1 * 9/2001 Anderson ........... G06F 11/1441
714/24
9,569,133 B2 2/2017 Kotzur et al.
(Continued)

FOREIGN PATENT DOCUMENTS

JP S62-239500 A 10/1987
JP H08-335396 A 12/1996
JP 2010-027163 A 2/2010

*Primary Examiner* — Craig S Goldschmidt
(74) *Attorney, Agent, or Firm* — Kim & Stewart LLP

(57) ABSTRACT

According to a magnetic disk apparatus of one embodiment, threshold voltages of memory cell transistors of a flash memory are set to a first section for a first value or to a second section for a second value. The second section is on a lower voltage side than the first section. The controller performs bit inversion of second data held in a volatile memory and writes the second data onto the flash memory when a power loss occurs while the second data corresponds to third data in which a number of the first values is larger than that of the second values. The controller writes the second data onto the flash memory without bit inversion when a power loss occurs while the second data corresponds to fourth data. The fourth data is data in which a number of the first values is smaller than that of the second values.

3 Claims, 7 Drawing Sheets

(51) Int. Cl.
    *G06F 12/02*     (2006.01)
    *G11C 11/401*     (2006.01)
    *G11C 11/56*     (2006.01)
    *G11C 16/06*     (2006.01)

(56) References Cited

U.S. PATENT DOCUMENTS

| | | | |
|---|---|---|---|
| 2010/0020619 A1* | 1/2010 | Sato | G06F 13/4239 |
| | | | 365/185.24 |
| 2010/0138594 A1 | 6/2010 | Huang | |
| 2011/0191552 A1 | 8/2011 | Sato | |
| 2018/0181302 A1* | 6/2018 | Liu | G06F 3/0688 |

* cited by examiner

| BIT INFORMATION TABLE | | |
|---|---|---|
| SECTOR ADDRESS | INVERSION FLAG | WRITING-UNNEEDED FLAG |
| a | Invalid | Invalid |
| b | Valid | Invalid |
| c | Invalid | Valid |
| d | Valid | Valid |
| ⋮ | ⋮ | ⋮ |

FIG.4

DATA BEFORE CONVERSION

| SECTOR ADDRESS | Bit [4095] | Bit [4094] | Bit [4093] | Bit [4092] | Bit [4091] | Bit [4090] | Bit [4089] | Bit [4088] | ... | Bit [2] | Bit [1] | Bit [0] |
|---|---|---|---|---|---|---|---|---|---|---|---|---|
| a | 1 | 1 | 1 | 0 | 1 | 1 | 0 | 1 | ... | 1 | 1 | 0 |
| b | 1 | 0 | 0 | 1 | 0 | 0 | 0 | 0 | ... | 0 | 1 | 0 |
| c | 1 | 1 | 1 | 1 | 0 | 1 | 1 | 1 | ... | 1 | 1 | 1 |
| d | 0 | 0 | 0 | 0 | 0 | 0 | 0 | 0 | ... | 0 | 0 | 0 |
| ... | ... | ... | ... | ... | ... | ... | ... | ... | ... | ... | ... | ... |

⇒

DATA AFTER CONVERSION

| SECTOR ADDRESS | Bit [4095] | Bit [4094] | Bit [4093] | Bit [4092] | Bit [4091] | Bit [4090] | Bit [4089] | Bit [4088] | ... | Bit [2] | Bit [1] | Bit [0] |
|---|---|---|---|---|---|---|---|---|---|---|---|---|
| a | 1 | 1 | 1 | 0 | 1 | 1 | 0 | 1 | ... | 1 | 1 | 0 |
| b | 0 | 1 | 1 | 0 | 1 | 0 | 1 | 1 | ... | 1 | 0 | 1 |
| c | 1 | 1 | 1 | 1 | 1 | 1 | 1 | 1 | ... | 1 | 1 | 1 |
| d | 1 | 1 | 1 | 1 | 1 | 1 | 1 | 1 | ... | 1 | 1 | 1 |
| ... | ... | ... | ... | ... | ... | ... | ... | ... | ... | ... | ... | ... |

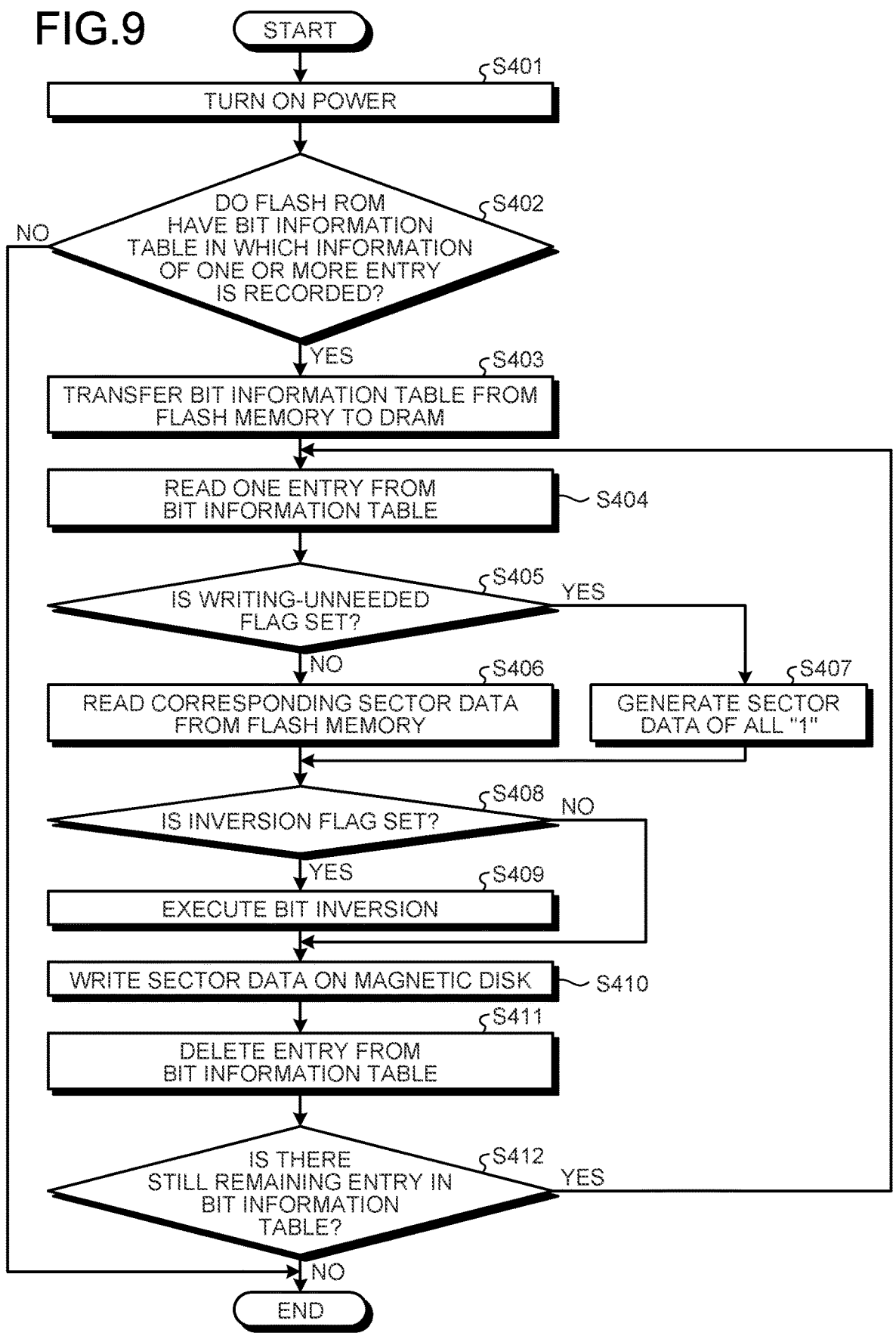

MAGNETIC DISK APPARATUS AND METHOD

CROSS-REFERENCE TO RELATED APPLICATIONS

This application is based upon and claims the benefit of priority from Japanese Patent Application No. 2022-045009, filed on Mar. 22, 2022, the entire contents of which are incorporated herein by reference.

FIELD

Embodiments described herein relate generally to a magnetic disk apparatus and a method.

BACKGROUND

Conventionally, in a magnetic disk apparatus, user data received from a host is temporarily stored in a volatile memory. After that, the user data stored in the volatile memory is written onto a magnetic disk.

In addition, there is a case where the conventional magnetic disk apparatus has a function of power loss protection. According to the power loss protection, when a power loss occurs, the user data in the volatile memory, which is not yet written onto the magnetic disk, is saved onto a flash memory by backup powers. This can prevents the user data in the volatile memory, which is not yet written onto the magnetic disk, from being lost from the magnetic disk apparatus.

BRIEF DESCRIPTION OF THE DRAWINGS

FIG. 4 is a schematic diagram for describing processing of bit inversion executed by a SoC according to the embodiment;

FIG. 9 is a flowchart illustrating an example of an operation of the magnetic disk apparatus according to the embodiment which operation is performed when power supply is resumed after the power loss.

DETAILED DESCRIPTION

Figure 1:
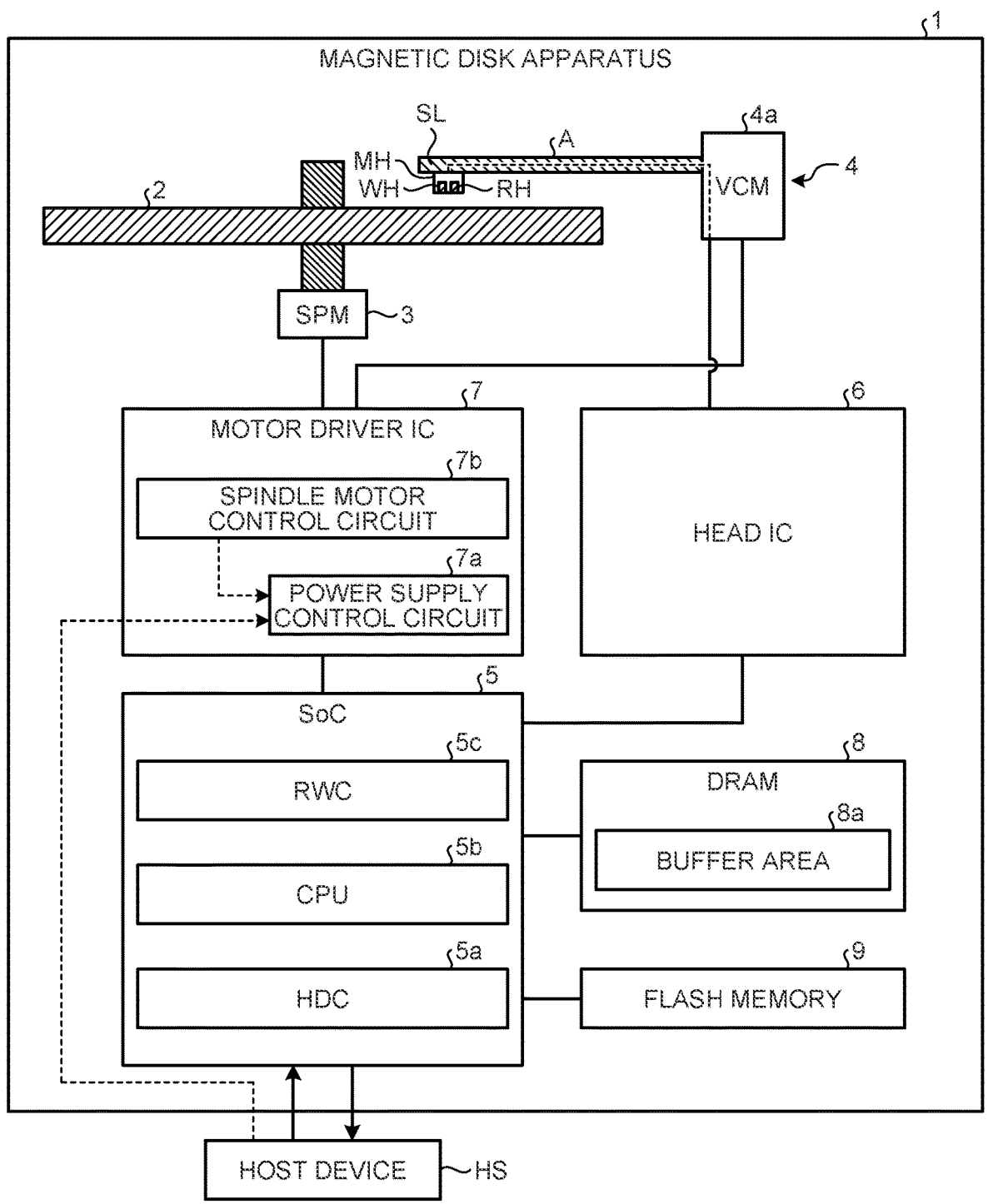
FIG. 1 is a block diagram illustrating an example of a configuration of a disk device according to an embodiment.

According to the present embodiment, a magnetic disk apparatus is connectable to a host device. The magnetic disk apparatus includes a magnetic disk, a flash memory, a volatile memory, and a controller. The flash memory includes memory cell transistors. Threshold voltages are set to a first section or a second section. The first section corresponds to a first value. The second section corresponds to a second value. The second section is on a lower voltage side than the first section. The volatile memory is configured to hold first data being data received from the host device until the first data is written onto the magnetic disk. The controller is configured to perform bit inversion of second data being the first data held in the volatile memory and write the second data onto the flash memory when a power loss occurs in a case where the second data corresponds to third data. The third data is data in which a number of the first values is larger than a number of the second values. The controller is configured to write the second data onto the flash memory without performing bit inversion when a power loss occurs in a case where the second data corresponds to fourth data. The fourth data is data in which a number of the first values is smaller than a number of the second values.

As the flash memory to be a saving destination of the user data in power loss protection, for example, a NOR-type flash memory, a NAND-type flash memory, or the like is used.

The flash memory includes a plurality of memory cell transistors. A threshold voltage of each of the memory cell transistors is set to a section corresponding to data in a plurality of sections, and thereby data is stored onto the memory cell transistors.

For example, in a flash memory of a type called a single level cell (SLC), one memory cell transistor can store binary data. One value (referred to as a first value) of the binary data corresponds to a section on a high voltage side, and the other value (referred to as a second value) of the binary data corresponds to a section on a low voltage side. When data is erased from the flash memory, the threshold voltage of the memory cell transistor is set to the section on the low voltage side. When data is written onto the flash memory in a case where the data to be written is the first value, electric charges are charged into an electric charge storage layer of the memory cell transistor, so that the threshold voltage of the memory cell transistor is boosted up to the section on the high voltage side. In a case where the data to be written is the second value, the threshold voltage of the memory cell transistor is maintained in the section on the low voltage side. When data is read from the flash memory, whether the data stored in the memory cell transistor is the first value or the second value is specified by determination whether the threshold voltage of the memory cell transistor belongs to the section on the high voltage side or the section on the low voltage side.

In the flash memory of the SLC type configured as described above, when user data is written, time required for the writing increases as the number of the first values (that is, value corresponding to the section on the high voltage side) included in the user data increases.

In a magnetic disk apparatus having a function of the power loss protection, after the power loss, backup power such as counter electromotive force generated in a spindle motor or power stored in a capacitor in advance is used for saving the user data. An amount of such power that can be used after the power loss is not large, and time during which the user data can be saved is limited. On the other hand, according to a characteristic of the flash memory of the SLC type described above, in a case where the number of the first values included in user data to be saved is large, the time required for storing of the user data to be saved onto the flash memory increases.

In the embodiment, when the power loss occurs in a case where the number of the first values included in the user data in the volatile memory is larger than the number of the second values included in the user data, the controller performs bit inversion of the user data and performs storing thereof onto the flash memory. When power supply is resumed, the controller further performs the bit inversion on the user data in the flash memory to restore the user data to a state before the saving, and writes the restored user data onto the magnetic disk.

Moreover, when the power loss occurs in a case where the number of the first values included in the user data in the volatile memory is smaller than the number of the second values included in the user data, the controller stores the user data onto the flash memory without performing bit inversion. When the power supply is resumed, the controller writes the user data in the flash memory onto the magnetic disk without performing bit inversion.

With the above configuration, the total number of first values stored in the flash memory is controlled. As a result, the time required for saving the user data is shortened. It is possible to securely save the user data onto the flash memory within limited time. Therefore, it is possible to prevent the user data from being lost from the magnetic disk apparatus, and reliability of the magnetic disk apparatus is improved.

Moreover, in the flash memory, a frequency of charging of electric charges into the electric charge storage layer of the memory cell transistor becomes higher as a frequency of writing of the first value becomes higher. As the frequency of charging of the electric charges into the electric charge storage layer of the memory cell transistor becomes higher, a speed at which the memory cell transistor is exhausted becomes higher, and a capacity of the memory cell transistor to hold data is decreased faster. A risk that data stored in the memory cell transistor is lost from the magnetic disk apparatus becomes higher as the capacity of the memory cell transistor to hold data becomes lower.

According to the magnetic disk apparatus of the embodiment having the above configuration, the frequency of writing of the first value onto the flash memory is controlled, so that a decrease in the capacity of the memory cell transistor to hold data is controlled. Therefore, the risk of losing the user data saved in the flash memory is controlled, and the reliability of the magnetic disk apparatus is improved.

In the following, a magnetic disk apparatus and a method according to the embodiment will be described in detail with reference to the accompanying drawings. Note that the present invention is not limited by this embodiment.

Embodiment

FIG. 1 is a block diagram illustrating an example of a configuration of a disk device according to the embodiment. A magnetic disk apparatus 1 can be connected to a host device HS. The magnetic disk apparatus 1 functions as an external storage device of the host device HS. The magnetic disk apparatus 1 is, for example, a hard disk drive.

The magnetic disk apparatus 1 includes a magnetic disk 2, a spindle motor (SPM) 3, a magnetic head MH, an actuator arm A, a voice coil motor (VCM) 4, a system-on-a-chip (SoC) 5, a head integrated circuit (IC) 6, a motor driver IC 7, a dynamic random access memory (DRAM) 8, and a flash memory 9. The SoC 5 includes a hard disc controller (HDC) 5a, a central processing unit (CPU) 5b, and a read write channel (RWC) 5c.

The magnetic disk 2 is a disk-shaped recording medium (for example, magnetic disk) capable of recording various kinds of information. The magnetic disk 2 is rotationally driven by the SPM 3.

While the magnetic disk apparatus 1 including one magnetic disk 2 is illustrated in FIG. 1, the number of magnetic disks 2 included in the magnetic disk apparatus 1 is not limited to one. More than one magnetic disks 2 may be included in one magnetic disk apparatus 1. In a case where the magnetic disks 2 are included in one magnetic disk apparatus 1, those magnetic disks 2 are integrally and rotationally driven.

The magnetic head MH is provided at one end of the actuator arm A. The magnetic head MH executes writing and reading of data onto and from the magnetic disk 2. The magnetic head MH includes a write head WH serving to write data onto the magnetic disk 2 and a read head RH serving to read data from the magnetic disk 2. The magnetic head MH is supported on a slider SL. The magnetic head MH moves in a down-track direction relative to a surface of the magnetic disk 2 while maintaining a state of slightly floating from the surface of the magnetic disk 2 by lift generated by the rotation of the magnetic disk 2.

The VCM 4 is provided at an end of the actuator arm A which end is opposite to the end where the magnetic head MH is provided. The VCM 4 rotationally drives the actuator arm A around a shaft 4a. As a result, the VCM 4 moves the magnetic head MH in a cross-track direction relative to the magnetic disk 2.

The DRAM 8 is a volatile memory that can operate at high speed. In the DRAM 8, a buffer area 8a used as a buffer memory for data transfer between the host device HS and the magnetic disk 2 is allocated. Specifically, the buffer area 8a holds user data, which is not yet written onto the magnetic disk 2, out of pieces of user data received from the host device HS.

In general, a speed of data transfer between a host device and a magnetic disk apparatus is faster than a speed of writing and reading of data onto and from a magnetic disk. When a volatile memory that operates at high speed is used as a buffer area for the data transfer between the host device and the magnetic disk apparatus, a data queue due to a difference between the speed of the data transfer between the host device and the magnetic disk apparatus and the speed of writing and reading of data onto and from the magnetic disk is eliminated.

Note that a kind of a non-volatile memory used as the buffer area is not limited to the DRAM. An SRAM may be applied as a non-volatile memory used as a buffer area.

The flash memory 9 is a memory in which a firmware program executed by the CPU 5b and various parameters are stored in a nonvolatile manner. Moreover, the flash memory 9 is used as a saving destination of user data at the time of a power loss. In the embodiment, a type of the flash memory 9 is the SLC. The flash memory 9 operates in accordance with data coding in which "0" corresponds to the section on the high voltage side and "1" corresponds to the section on the low voltage side. That is, "0" is an example of the first value, and "1" is an example of the second value. Note that the data coding is not limited to this example. A flash memory that operates in accordance with data coding in which "1" corresponds to the section on the high voltage side and "0" corresponds to the section on the low voltage side can be also applied.

The head IC 6 writes data to the magnetic disk 2 by causing a write signal (current) corresponding to data input from the RWC 5c to flow to the write head WH. In addition, the head IC 6 amplifies a read signal output from the read head RH (data read from the magnetic disk 2 by the read head RH), and supplies the amplified read signal to the RWC 5c.

The RWC 5c included in the SoC 5 performs code modulation of the user data stored in the buffer area 8a and outputs the code-modulated data to the head IC 6. In addition, the RWC 5c performs code demodulation of the data transmitted from the head IC 6 and outputs the code-demodulated user data to the buffer area 8a.

The HDC 5a included in the SoC 5 stores the user data received from the host device HS into the buffer area 8a. The HDC 5a transmits, to the host device HS, the user data that is read from the magnetic disk 2 and stored in the buffer area 8a.

The CPU 5b included in the SoC 5 performs overall control of the operation of the entire magnetic disk apparatus 1 on the basis of the firmware program.

Note that the SoC 5 is an example of a controller of the embodiment. Note that the controller of the embodiment is not necessarily configured as a SoC. The controller of the embodiment may include two or more chips. In addition, the controller of the embodiment may include components other than the HDC 5a, the CPU 5b, and the RWC 5c (such as DRAM 8, flash memory 9, or another circuit).

The motor driver IC 7 controls power supply to each unit included in the magnetic disk apparatus 1. Moreover, the motor driver IC 7 controls driving of the VCM 4. The motor driver IC 7 includes a power supply control circuit 7a, and a spindle motor control circuit 7b. The spindle motor control circuit 7b controls a rotation of the SPM 3.

The power supply control circuit 7a receives power supplied from the host device HS (example of external power supply) and generates, on the basis of the power, power to drive each unit of the magnetic disk apparatus 1. Generating power includes, for example, processing such as rectification, boosting, or stepping down. The power supply control circuit 7a supplies the generated power to each unit of the magnetic disk apparatus 1. The power supply control circuit 7a may directly supply the supplied power to each unit.

In addition, in a case where power supply from the host device HS is suddenly interrupted (that is, in a case where the power loss occurs), the power supply control circuit 7a detects the power loss. In a case where the power loss is detected, the power supply control circuit 7a receives counter electromotive force generated in the SPM 3 via the spindle motor control circuit 7b. Then, the power supply control circuit 7a generates power to drive each unit on the basis of the counter electromotive force received from the SPM 3, and supplies the generated power to each unit of the magnetic disk apparatus 1.

In such a manner, the power supply control circuit 7a generates the power supplied to each unit on the basis of the counter electromotive force generated when the SPM 3 is stopped. Thus, the magnetic disk apparatus 1 can operate by using the counter electromotive force for a while after the power loss. During this period, power loss protection is executed in the magnetic disk apparatus 1.

In the power loss protection, the user data in the buffer area 8a is saved onto the flash memory 9. Saving may be referred to as transferring, copying, or storing. Saving may include a process of processing data, such as compression, encoding, or format conversion. Hereinafter, processing of saving the user data in the buffer area 8a onto the flash memory 9 may be referred to as backup.

The power supply control circuit 7a asserts a backup enable signal in a case where the power loss is detected. The backup enable signal is a signal indicating that backup can be executed. The backup enable signal is supplied from the power supply control circuit 7a to the SoC 5. After asserting the backup enable signal, the power supply control circuit 7a negates the backup enable signal when a voltage supplied to each unit falls below a predetermined threshold.

The above threshold can be arbitrarily set as long as being larger than a voltage value required for the SoC 5 to execute the backup. For example, a voltage value required for the SoC 5 to execute the backup may be set as the threshold. A value acquired by addition of a predetermined margin to the voltage value required for the SoC 5 to execute the backup may be set as the threshold.

The CPU 5b starts control of the backup in response to assertion of the backup enable signal. While power is supplied from the host device HS, the backup enable signal is maintained in a negated state. In that case, the CPU 5b executes control of a normal operation by controlling the SoC 5. The control of the normal operation includes transmission and reception of a command and data to and from the host device HS, and access (writing and reading) to the magnetic disk 2. When the backup enable signal is asserted, the CPU 5b stops the control of the normal operation, and instructs each unit to start the backup.

Figures 2, 3:
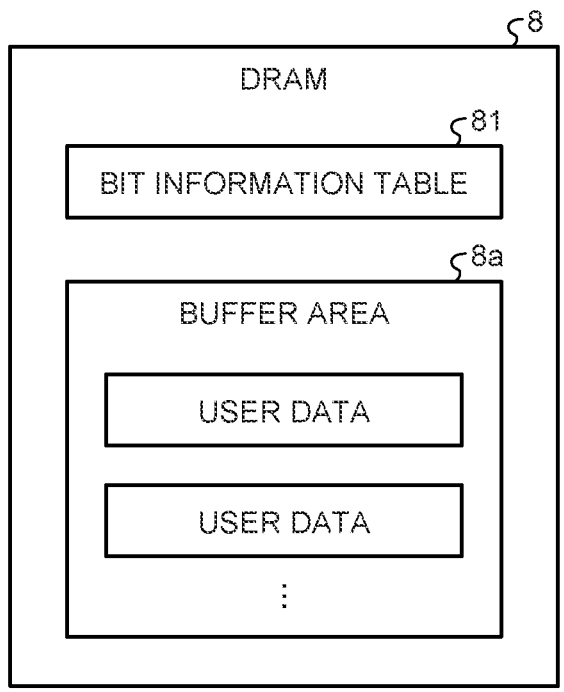
FIG. 2 is a schematic diagram for describing an example of various kinds of information stored in a DRAM according to the embodiment.
FIG. 3 is a schematic diagram illustrating an example of a data structure of a bit information table according to the embodiment.

FIG. 2 is a schematic diagram for describing an example of various kinds of information stored in the DRAM 8 according to the embodiment.

As described above, the buffer area 8a in which the user data is stored is allocated in the DRAM 8. In addition, the DRAM 8 stores a bit information table 81 in which information to be used for the backup is recorded with respect to the user data received from the host device HS and stored in the buffer area 8a.

FIG. 3 is a schematic diagram illustrating an example of a data structure of the bit information table 81 according to the embodiment.

Each entry of the bit information table 81 includes a field in which a sector address is recorded, a field in which an inversion flag is recorded, and a field in which a writing-unneeded flag is recorded.

The magnetic disk apparatus 1 provides the host device HS with a logical address space that can be used for position designation. A large number of sectors each of which can store data of a predetermined size are provided in the magnetic disk 2. A large number of sectors included in the magnetic disk 2 are mapped to the logical address space. A size of the user data that can be stored in a sector is typically 512 bytes (that is, 4096 bits). Note that the size of the user data that can be stored in the sector is not limited to 512 bytes. In addition, the magnetic disk 2 may include a sector that is not mapped to the logical address space. For example, system data of the magnetic disk apparatus 1 may be stored in the sector that is not mapped to the logical address space.

In a case of requesting the magnetic disk apparatus 1 to write user data, the host device HS transmits a write command corresponding to the user data to the magnetic disk apparatus 1. The write command includes a logical address. In the magnetic disk apparatus 1, the SoC 5 divides the user data, which is requested to be written, in units of sectors. Then, the SoC 5 writes a group of data pieces of the divided user data into a group of one or more sectors in which group a position indicated by the logical address included in the received write command in the magnetic disk 2 is a head.

Therefore, a sector of a writing destination of each of the data pieces in units of sectors which data pieces are included in the user data received from the host device HS is uniquely determined. The SoC 5 manages each data piece of the user data, which is received from the host device HS and stored in the buffer area 8*a*, in association with a logical address of a sector of a writing destination. A sector address recorded in the bit information table 81 is a logical address of a sector of a writing destination of one data piece received from the host device HS and stored in the buffer area 8*a*. The SoC 5 stores each of the data pieces in units of sectors, which data pieces are stored in the buffer area 8*a*, in association with a sector address. Note that the data pieces in units of sectors which data pieces are generated by division of the user data are hereinafter referred to as sector data.

The inversion flag is bit information that is set in a case where the number of "0" included in the sector data is larger than the number of "1" included in the sector data. In the present specification, as an example, a value indicating "Invalid" is recorded in an initial state in a field in which the inversion flag is recorded. Then, in a case where a determination is made such that the number of "0" is larger than the number of "1" as a result of comparison between the number of "0" and the number of "1" included in the sector data, a value indicating "Valid" is recorded in the field in which the inversion flag is recorded. In a case where the inversion flag is set, that is, in a case where the value indicating "Valid" is recorded as the inversion flag, the sector data indicated by an entry including the inversion flag is bit-inverted and then saved onto the flash memory 9 at the time of the power loss. In addition, in a case where the power supply is resumed after the power loss, the sector data saved onto the flash memory 9 is restored to the original sector data by bit inversion, and is then written onto the magnetic disk 2.

In a case where the number of "0" is not larger than the number of "1", the inversion flag is not set. That is, in the example of the present specification, the inversion flag is maintained at a value indicating "Invalid".

Note that processing of a case where the number of "0" is equal to the number of "1" is not limited to the above example. Even in a case where the number of "0" is equal to the number of "1", the inversion flag may be set, and corresponding sector data may be bit-inverted at the time of the power loss.

The writing-unneeded flag is bit information indicating that writing onto the flash memory 9 is not necessary at the time of the backup. In the embodiment, writing of sector data of all "1" and writing of sector data becoming all "1" by bit inversion (that is, sector data of all "0") onto the flash memory 9 are omitted. All "1" refers to data exclusively including "1", and all "0" refers to data exclusively including "0". In the present specification, as an example, a value indicating "Invalid" is recorded in an initial state in a field in which the writing-unneeded flag is recorded. Then, in a case where the sector data is all "1" or all "0", a value indicating "Valid" is recorded in the field in which the writing-unneeded flag is recorded. In a case where the writing-unneeded flag is set, that is, in a case where the value indicating "Valid" is recorded as the writing-unneeded flag, the sector data indicated by an entry including the writing-unneeded flag is not saved onto the flash memory 9 at the time of the power loss. In a case where the power supply is resumed after the power loss, sector data of all "1" is generated and is written onto the magnetic disk 2 with or without performing the bit inversion according to the inversion flag.

When storing user data received from the host device HS into the buffer area 8*a*, the SoC 5 adds an entry to the bit information table 81 for each sector data constituting the user data. At the time of the power loss, the SoC 5 saves each piece of the sector data according to the bit information table 81.

In addition, at the time of the power loss, the SoC 5 transfers the bit information table 81 from the DRAM 8 to the flash memory 9. As a result, the bit information table 81 is non-volatilized.

When the power supply is resumed, the SoC 5 restores each piece of the sector data before saving, on the basis of the non-volatilized bit information table 81.

In the example illustrated in FIG. 3, sector data in which a sector with a sector address "a" is a writing destination, sector data in which a sector with a sector address "b" is a writing destination, sector data in which a sector with a sector address "c" is a writing destination, and sector data in which a sector with a sector address "d" is a writing destination are stored in the buffer area 8*a*. In the sector data in which the sector with the sector address "a" is the writing destination and the sector data in which the sector with the sector address "c" is the writing destination, the number of "0" is not larger than the number of "1". Thus, the inversion flag is not set in an entry corresponding to each of those pieces of the sector data. In the sector data in which the sector with the sector address "b" is the writing destination and the sector data in which the sector with the sector address "d" is the writing destination, the number of "0" is larger than the number of "1". Thus, the inversion flag is set in an entry corresponding to each piece of the sector data. The sector data in which the sector with the sector address "a" is the writing destination and the sector data in which the sector with the sector address "b" is the writing destination are neither all "0" nor all "1". Thus, the writing-unneeded flag is not set in the entry corresponding to each piece of the sector data. The sector data in which the sector with the sector address "c" is the writing destination and the sector data in which the sector with the sector address "d" is the writing destination are all "0" or all "1". Thus, the writing-unneeded flag is set in the entry corresponding to each piece of the sector data.

When the power loss occurs, the SoC 5 executes the bit inversion of the sector data in which the sector with the sector address "b" is the writing destination and the sector data in which the sector with the sector address "d" is the writing destination, the inversion flag being set in the corresponding entry in each piece of the sector data. The SoC 5 does not execute the bit inversion on the sector data in which the sector with the sector address "a" is the writing destination and the sector data in which the sector with the sector address "c" is the writing destination in each of which pieces of sector data the corresponding inversion flag is not set.

FIG. 4 is a schematic diagram for describing processing of the bit inversion executed by the SoC 5 according to the embodiment. Note that the example illustrated in FIG. 4 corresponds to the example of the bit information table 81 illustrated in FIG. 3.

As illustrated in FIG. 4, "0" is converted to "1" and "1" is converted to "0" for each bit included in a bit string of the sector data in which the sector with the sector address "b" is the writing destination. Also for each bit included in a bit string of the sector data in which the sector with the sector address "d" is the writing destination, "0" is converted to "1" and "1" is converted to "0". By such bit inversion, the number of "1" becomes larger than the number of "0".

After the bit inversion, the SoC 5 stores, onto the flash memory 9, the sector data in which the sector with the sector address "a" is the writing destination and the sector data in which the sector with the sector address "b" is the writing destination in each of which pieces of sector data the writing-unneeded flag is not set in a corresponding entry.

Next, an operation of the magnetic disk apparatus 1 will be described.

Figure 5:
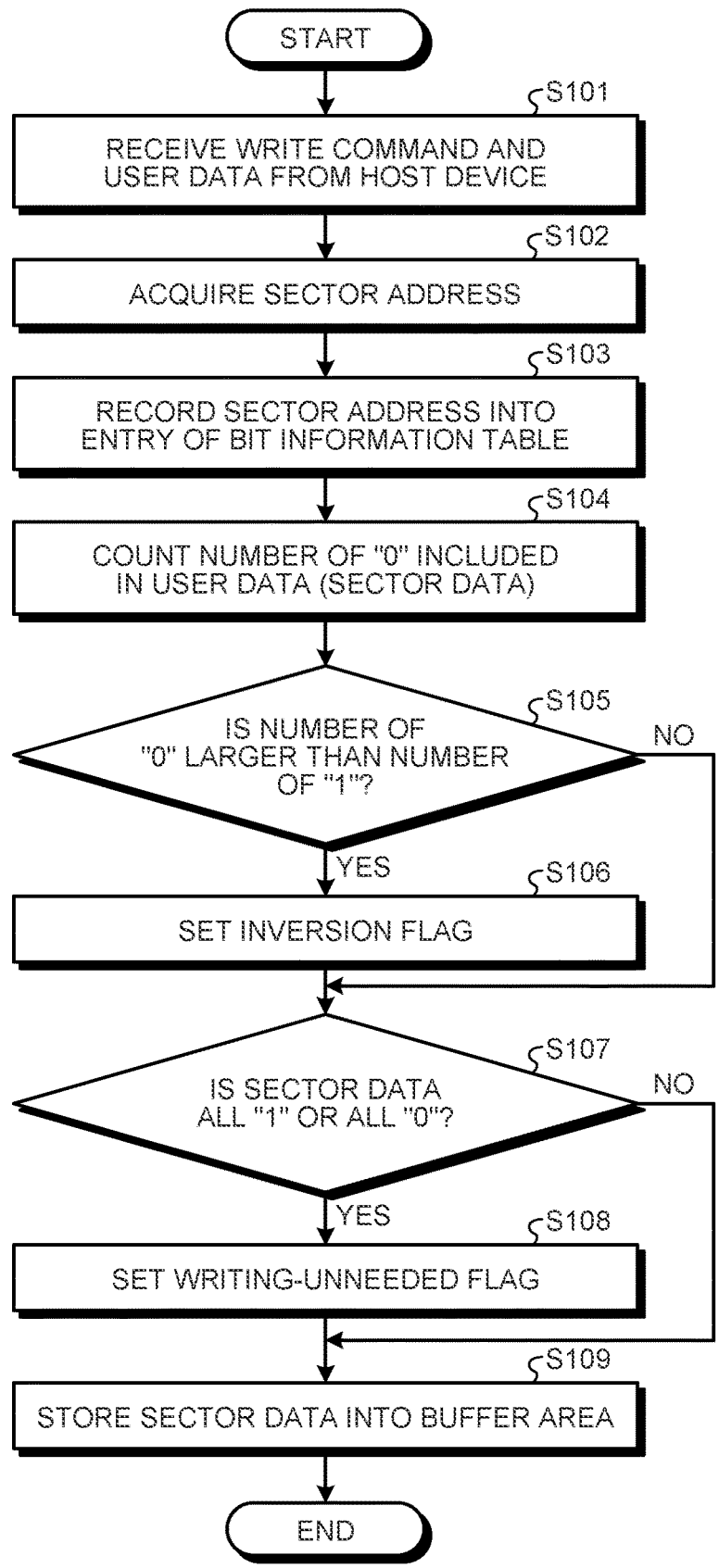
FIG. 5 is a flowchart illustrating an example of an operation of a magnetic disk apparatus according to the embodiment which operation is performed when user data is received from a host device.

FIG. 5 is a flowchart illustrating an example of the operation of the magnetic disk apparatus 1 according to the embodiment of when the user data is received from the host device HS.

On receiving a write command and user data from the host device HS (S101), the SoC 5 acquires a sector address indicating a sector as a writing destination of the user data (S102). In a case where a size of the received user data has sizes of plural sectors, the SoC 5 divides the user data in units of sectors and acquires a sector address for each piece of the divided sector data. Then, processing of S103 to S109 is executed for each piece of the divided sector data. In order to simplify the description, the description will be made on the assumption that the data received from the host device HS is data of a sector size, that is, sector data.

The SoC 5 records the acquired sector address in a new entry of the bit information table 81 (S103). Then, the SoC 5 counts the number of "0" included in the received sector data (S104). Sizes of all pieces of sector data are fixed. Thus, if the number of "0" included in the sector data is known, the number of "1" included in the sector data can be derived. The processing of S104 corresponds to processing of specifying the number of "0" and the number of "1" included in the sector data.

After S104, the SoC 5 determines whether the number of "0" is larger than the number of "1" (S105).

In a case where the number of "0" is larger than the number of "1" (S105: Yes), the SoC 5 sets an inversion flag (S106). Specifically, the SoC 5 records a value indicating "Valid" into a field where the inversion flag is recorded in the entry in which the sector address was recorded in S103.

In a case where the number of "0" is not larger than the number of "1" (S105: No), or after S106, the SoC 5 determines whether the sector data is all "1" or all "0" (S107).

In a case where the sector data is all "1" or all "0" (S107: Yes), the SoC 5 sets a writing-unneeded flag (S108). Specifically, the SoC 5 records a value indicating "Valid" into a field where the writing-unneeded flag is recorded in the entry in which the sector address was recorded in S103.

In a case where the sector data is neither all "1" nor all "0" (S107: No), or after S108, the SoC 5 stores the sector data into the buffer area 8*a* (S109). Then, the operation of the control by the SoC 5 at the time when the magnetic disk apparatus 1 receives the user data from the host device HS ends.

Figure 6:
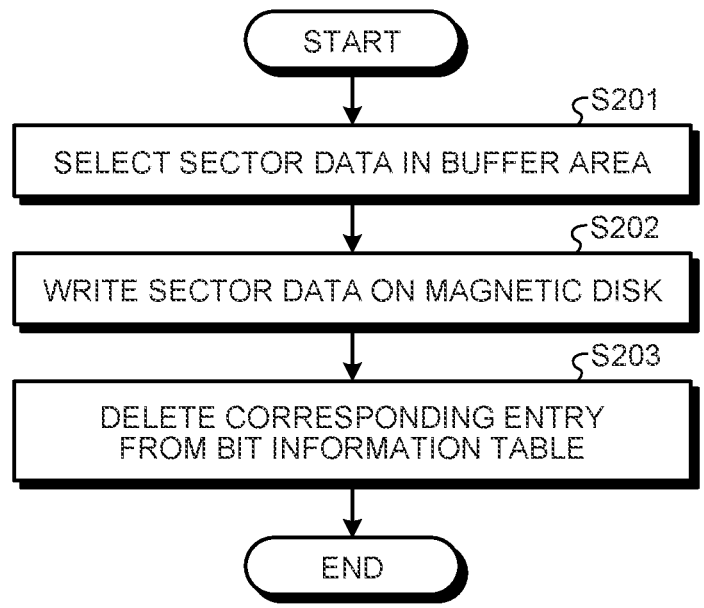
FIG. 6 is a flowchart illustrating an example of an operation of writing sector data stored in a buffer area onto a magnetic disk by the magnetic disk apparatus according to the embodiment.

FIG. 6 is a flowchart illustrating an example of the operation of writing the sector data stored in the buffer area 8*a* onto the magnetic disk 2 by the magnetic disk apparatus 1 according to the embodiment. A series of processing illustrated in FIG. 6 is executed in a case where sector data that is not yet written onto the magnetic disk 2 is present in the buffer area 8*a*. The series of processing can be executed when there is no other processing to be prioritized, when there is no free space in the buffer area 8*a*, or the like.

The SoC 5 selects sector data present in the buffer area 8*a* (S201). The SoC 5 writes the selected sector data onto the magnetic disk 2 (S202). The SoC 5 deletes an entry corresponding to the selected sector data from the bit information table 81 (S203). Then, the operation of writing the sector data stored in the buffer area 8*a* onto the magnetic disk 2 ends. The sector data having already been written onto the magnetic disk 2 is deleted from the buffer area 8*a*, or a position where this sector data was held in the buffer area 8*a* is released.

As described above, when the power loss occurs, the power supply control circuit 7*a* generates the power to be supplied to each unit, on the basis of the counter electromotive force generated when the SPM 3 is stopped.

Figure 7:
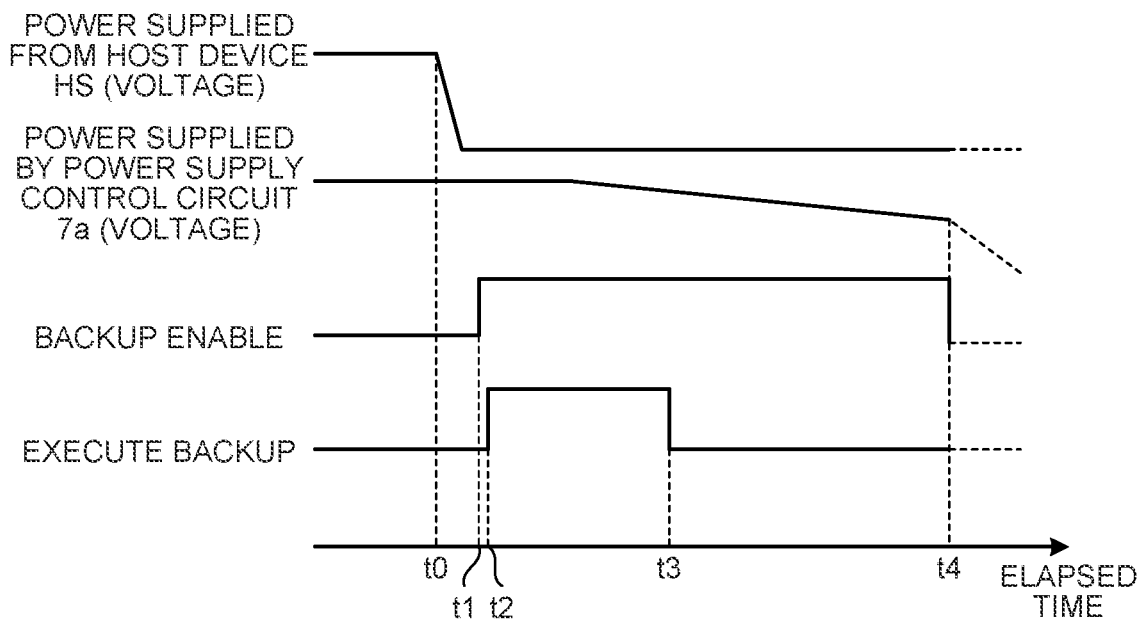
FIG. 7 is a view for describing an operation of a power supply control circuit according to the embodiment which operation is performed when a power loss occurs.

FIG. 7 is a view for describing an operation of the power supply control circuit 7*a* according to the embodiment which operation is performed when the power loss occurs. The present drawing illustrates a temporal transition of the power supplied from the host device HS, a temporal transition of the power supplied to each unit by the power supply control circuit 7*a*, a temporal transition of the backup enable signal, and backup execution timing.

When the power loss occurs at time t0, the power supply control circuit 7*a* generates the power to be supplied to each unit, on the basis of the counter electromotive force. Therefore, the power supply control circuit 7*a* can supply the power without voltage fluctuation before and after the generation of the power loss. The power supply control circuit 7*a* asserts the backup enable signal after detecting the power loss (time t1). When a voltage value of the generated power falls below a predetermined value, the power supply control circuit 7*a* negates the backup enable signal (time t4). When the backup enable signal is asserted, the SoC 5 starts the backup (time t2), and ends the backup before time t4 when the backup enable signal is negated (time t3).

Figure 8:
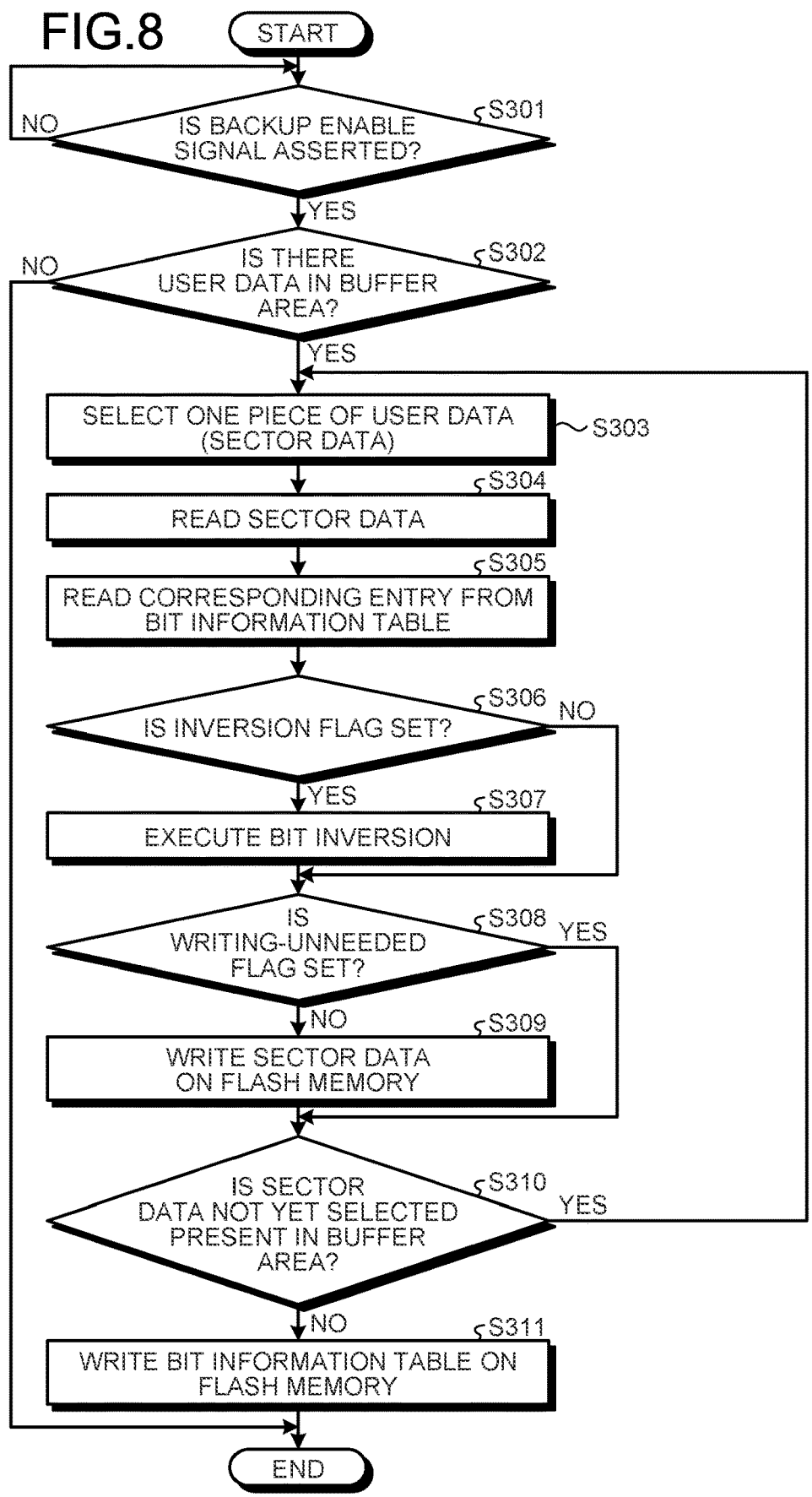
FIG. 8 is a flowchart illustrating an example of a backup operation in the magnetic disk apparatus according to the embodiment.

FIG. 8 is a flowchart illustrating an example of a backup operation in the magnetic disk apparatus 1 according to the embodiment.

The SoC 5 monitors whether the backup enable signal is asserted (S301). In a case where the backup enable signal is not asserted (S301: No), the SoC 5 continues the processing of S301.

When the backup enable signal is asserted (S301: Yes), the SoC 5 determines whether user data not yet written onto the magnetic disk 2 is present in the buffer area 8*a* (S302).

In a case where the user data not yet written onto the magnetic disk 2 is present in the buffer area 8*a* (S302: Yes), the SoC 5 selects the user data not yet written onto the magnetic disk 2 (S303). In S303, the SoC 5 selects one piece of sector data. The SoC 5 reads the sector data from the buffer area 8*a* (S304), and reads a corresponding entry from the bit information table 81 (S305).

Then, the SoC 5 determines whether the inversion flag is set or not by making a reference to a field in which the inversion flag is recorded in the read entry (S306). In a case where the inversion flag is set (S306: Yes), the SoC 5 executes the bit inversion on the sector data selected in S303 (S307).

In a case where the inversion flag is not set (S306: No), or after S307, the SoC 5 determines whether the writing-unneeded flag is set or not by making a reference to a field in which the writing-unneeded flag is recorded in the read entry (S308).

In a case where the writing-unneeded flag is not set (S308: No), the SoC 5 writes the sector data onto the flash memory 9 (S309). In a case where the writing-unneeded flag is set (S308: Yes), the SoC 5 skips the processing of S309.

In a case where the writing-unneeded flag is set (S308: Yes), or after S309, the SoC 5 determines whether sector data not yet selected is present in the buffer area 8*a* (S310). In a case where the sector data not yet selected is present in the buffer area 8a, the control transitions to S303, and the SoC 5 selects one piece of the sector data not yet selected. Then, the processing of S304 to S310 is executed again.

In a case where the sector data not yet selected is not present in the buffer area 8a (S310: No), the SoC 5 writes the bit information table 81 onto the flash memory 9 (S311). Then, the backup operation is completed.

FIG. 9 is a flowchart illustrating an example of an operation of the magnetic disk apparatus 1 according to the embodiment which operation is performed when the power supply is resumed after the power loss.

First, when the power is turned on after the power loss (S401), the SoC 5 determines whether the flash memory 9 has a bit information table 81 in which information of one or more entries is recorded (S402).

In a case where the bit information table 81 in which the information of one or more entries is recorded is not present in the flash memory 9 (S402: No), the operation of when the power supply is resumed after the power loss ends. Then, a normal operation corresponding to the access command from the host device HS is started.

In a case where the bit information table 81 in which the information of one or more entries is recorded is present in the flash memory 9 (S402: Yes), the SoC 5 transfers the bit information table 81 from the flash memory 9 to the DRAM 8 (S403).

The SoC 5 reads one entry from the bit information table 81 in the DRAM 8 (S404). Then, by making a reference to a field in which the writing-unneeded flag is recorded in the entry, the SoC 5 determines whether the writing-unneeded flag is set or not (S405).

In a case where the writing-unneeded flag is not set (S405: No), it is estimated that the sector data corresponding to the read entry is saved in the flash memory 9. In this case, the SoC 5 reads the corresponding sector data from the flash memory 9 (S406).

In a case where the writing-unneeded flag is set (S405: Yes), the sector data corresponding to the read entry is all "0" or all "1" and is not saved in the flash memory 9. In this case, the SoC 5 generates the sector data of all "1" (S407).

After S406 or S407, by making a reference to a field in which the inversion flag is recorded in the entry, the SoC 5 determines whether the inversion flag is set (S408).

In a case where the inversion flag is set (S408: Yes), the SoC 5 executes the bit inversion on the sector data acquired by the processing of S406 or S407 (S409).

In a case where the inversion flag is not set (S408: No), or after S409, the SoC 5 writes the sector data onto the magnetic disk 2 (S410). Then, the SoC 5 deletes the corresponding entry from the bit information table 81 in the DRAM 8 (S411).

Subsequently, the SoC 5 determines whether there is still a remaining entry in the bit information table 81 in the DRAM 8 (S412). In a case where there is still the remaining entry in the bit information table 81 in the DRAM 8 (S412: Yes), the control proceeds to S404, and the SoC 5 reads the entry. Then, the processing of S405 to S412 is executed again.

In a case where no entry remains in the bit information table 81 in the DRAM 8 (S412: No), the operation of when the power supply is resumed after the power loss ends. Then, the normal operation corresponding to the access command from the host device HS is started.

As described above, the SoC 5 causes the DRAM 8, which is a volatile memory, to hold the user data received from the host device HS until the user data is written onto the magnetic disk 2. When the power loss occurs while the user data held in the DRAM 8 is data in which the number of first values ("0" in the above example) is larger than that of second values ("1" in the above example), the SoC 5 performs the bit inversion of the user data and writes the user data onto the flash memory 9. When the power loss occurs while the user data held in the DRAM 8 is data in which the number of the first values is smaller than that of the second values, the SoC 5 writes the user data onto the flash memory 9 without performing the bit inversion.

With the above configuration, the total number of first values stored in the flash memory 9 is controlled. As a result, the time required for saving the user data is shortened. Since it is possible to securely save the user data onto the flash memory 9 within a limited time, it is possible to prevent the user data from being lost from the magnetic disk apparatus 1, and reliability of the magnetic disk apparatus 1 is improved.

Moreover, the frequency of writing of the first value onto the flash memory 9 is controlled, so that a decrease in the capacity of the memory cell transistor to hold data is controlled. Therefore, the risk of losing the user data saved in the flash memory 9 is controlled, and the reliability of the magnetic disk apparatus 1 is improved.

That is, according to the embodiment, it is possible to provide the magnetic disk apparatus 1 with high reliability.

In addition, according to the embodiment, when the power supply is resumed after the power loss in a case where the user data written onto the flash memory 9 corresponds to data in which the number of the first values is larger than the number of the second values, the SoC 5 performs bit inversion of the user data and writes the user data onto the magnetic disk 2. When the power supply is resumed after the power loss in a case where the user data written onto the flash memory 9 corresponds to data in which the number of the first values is smaller than the number of the second values, the SoC 5 writes the user data onto the magnetic disk 2 without performing the bit inversion.

In addition, according to the embodiment, when the SoC 5 writes the user data onto the flash memory 9, the bit information table 81 in which the inversion flag is recorded is written onto the flash memory 9. The inversion flag is information that indicates whether to execute the bit inversion and that is determined on the basis of comparison between the number of the first values and the number of the second values. It can be considered that the inversion flag indicates whether the corresponding user data corresponds to the data in which the number of the first values is larger than the number of the second values, or the corresponding user data corresponds to the data in which the number of the first values is smaller than the number of the second values. When the power supply is resumed after the power loss, the SoC 5 determines whether to execute the bit inversion on the corresponding user data on the basis of the inversion flag recorded in the bit information table 81.

Therefore, the user data bit-inverted at the time of saving is restored to the original user data by being bit-inverted again after the power supply is resumed.

Moreover, according to the embodiment, when writing the user data into the DRAM 8, the SoC 5 counts the number of the first values and the number of the second values included in the user data and generates the inversion flag on the basis of a result of the count.

As described above, the SoC 5 counts the number of the first values and the number of the second values not at the time of backup but at the time of writing of the user data onto the DRAM 8. Therefore, the amount of processing executed at the time of the backup can be reduced. That is, it is possible to efficiently use available power at the time of the backup.

In addition, according to the embodiment, when the power loss occurs in a case where the user data corresponds to data that exclusively includes either the first value or the second value, the SoC 5 writes the bit information table 81, in which the writing-unneeded flag is set, onto the flash memory 9 without writing the user data onto the flash memory 9. The writing-unneeded flag is a flag set in a case where the user data is data exclusively including either the first value or the second value. When the power supply is resumed, in a case where the inversion flag is set and the writing-unneeded flag is set, the SoC 5 generates user data exclusively including the first value and writes the user data onto the magnetic disk 2. When the power supply is resumed, in a case where the inversion flag is not set and the writing-unneeded flag is set, the SoC 5 generates user data exclusively including the second value and writes the user data onto the magnetic disk 2.

Therefore, the total amount of data written onto the flash memory 9 is controlled and a time required for the backup is further shortened.

Moreover, according to the embodiment, when writing the user data onto the DRAM 8, the SoC 5 counts the number of the first values and the number of the second values included in the user data and generates the writing-unneeded flag on the basis of a result of the count.

Therefore, the amount of processing executed at the time of the backup can be reduced. That is, it is possible to efficiently use available power at the time of the backup.

In addition, according to the embodiment, the SoC 5 manages the backup of the user data in units of sectors.

The units of management of the backup and the units of management of the writing destination with respect to the magnetic disk 2 are unified, so that the overall management is simplified. Note that the units of management of the backup are not necessarily the units of sectors. In addition, while it has been described in the above example that the size of data of one sector is 512 bytes, the size of data of one sector is not limited to 512 bytes.

In the above description, the power loss may include not only an unintended stop of the power supply but also a stop of the power supply according to a normal power-off sequence. The embodiment can be also applied to a case where the power supply to the magnetic disk apparatus 1 is stopped according to the normal power-off sequence.

While certain embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic disk apparatus connectable to a host device, the magnetic disk apparatus comprising:
    a magnetic disk;
    a flash memory including memory cell transistors, each of the memory cell transistors storing one of first and second values;
    a volatile memory configured to temporarily hold first data received from the host device until data corresponding to the first data is written onto the magnetic disk; and
    a controller configured to
    when a power loss occurs,
        perform bit inversion of the first data held in the volatile memory and write bit-inverted data of the first data as second data onto the flash memory in a case where a number of the first values in the first data is larger than a number of the second values in the first data, but not all values of the first data are the first values,
        write the first data as third data onto the flash memory without performing bit inversion in a case where the number of the first values in the first data is smaller than the number of the second values in the first data, but not all values of the first data are the second values,
        write, onto the flash memory, first information indicating whether the number of the first values in the first data is larger or smaller than the number of the second values in the first data, and
        in a case where the first data exclusively includes the first values or exclusively includes the second values, write onto the flash memory second information indicating that the first data exclusively includes the first values or exclusively includes the second values without writing the second data or the third data onto the flash memory, and
    when power supply is resumed after the power loss,
        perform the bit inversion of the second data written onto the flash memory and write bit-inverted data of the second data onto the magnetic disk in a case where the second information is not written onto the flash memory and the first information indicates that the number of the first values in the first data is larger than the number of the second values in the first data,
        write the third data onto the magnetic disk without performing bit inversion in a case where the second information is not written onto the flash memory and the first information indicates that the number of the first values in the first data is smaller than the number of the second values in the first data,
        generate data exclusively including the first values as fourth data and write the fourth data onto the magnetic disk, in a case where the second information is written onto the flash memory and the first information indicates that the number of the first values in the first data is larger than the number of the second values in the first data, and
        generate data exclusively including the second values as fifth data and write the fifth data onto the magnetic disk, in a case where the second information is written onto the flash memory and the first information indicates that the number of the first values in the first data is smaller than the number of the second values in0 the first data.

2. The magnetic disk apparatus according to claim 1, wherein the controller is configured to,
    count the number of the first values and the number of the second values included in the first data,
    specify whether the number of the first values in the first data is larger or smaller than the number of the second values in the first data on the basis of a result of the count, and
    generate the first information on the basis of a result of the specification.

3. The magnetic disk apparatus according to claim 1, wherein the first data is data in units of sectors.

\* \* \* \* \*